United States Patent
Zhang et al.

(10) Patent No.: US 9,703,024 B2
(45) Date of Patent: Jul. 11, 2017

(54) SYSTEMS, METHODS, AND APPARATUS FOR PRODUCTION COATINGS OF LOW-EMISSIVITY GLASS INCLUDING A TERNARY ALLOY

(71) Applicants: Intermolecular Inc., San Jose, CA (US); Guardian Industries Corp., Auburn Hills, MI (US)

(72) Inventors: Guizhen Zhang, Santa Clara, CA (US); Brent Boyce, Novi, MI (US); Jeremy Cheng, Cupertino, CA (US); Guowen Ding, San Jose, CA (US); Muhammad Imran, Hamilton, NJ (US); Daniel Schweigert, Fremont, CA (US); Yongli Xu, Plymouth, MI (US)

(73) Assignees: Intermolecular Inc., San Jose, CA (US); Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 15/346,884

(22) Filed: Nov. 9, 2016

(65) Prior Publication Data
US 2017/0052297 A1 Feb. 23, 2017

Related U.S. Application Data

(63) Continuation of application No. 14/139,350, filed on Dec. 23, 2013, now Pat. No. 9,499,899.
(Continued)

(51) Int. Cl.
*G02B 5/20* (2006.01)
*C03C 17/36* (2006.01)
(Continued)

(52) U.S. Cl.
CPC ............ *G02B 5/208* (2013.01); *C03C 17/366* (2013.01); *C03C 17/3626* (2013.01);
(Continued)

(58) Field of Classification Search
CPC .......... G02B 1/115; G02B 1/116; G02B 5/26; G02B 5/28; G02B 5/281; G02B 5/282;
(Continued)

(56) References Cited

U.S. PATENT DOCUMENTS

| 5,525,430 A | 6/1996 | Chahroudi |
| 5,591,529 A | 1/1997 | Braatz et al. |

(Continued)

FOREIGN PATENT DOCUMENTS

| CN | 102803174 A | 11/2012 |
| EP | 1 538 131 | 6/2005 |

(Continued)

OTHER PUBLICATIONS

U.S. Appl. No. 14/139,350, filed Dec. 23, 2013; Zhang et al.
(Continued)

*Primary Examiner* — Derek S Chapel
*Assistant Examiner* — Adam W Booher
(74) *Attorney, Agent, or Firm* — Nixon & Vanderhye P.C.

(57) ABSTRACT

Disclosed herein are systems, methods, and apparatus for forming low emissivity panels that may include a substrate and a reflective layer formed over the substrate. The low emissivity panels may further include a top dielectric layer formed over the reflective layer such that the reflective layer is formed between the top dielectric layer and the substrate. The top dielectric layer may include a ternary metal oxide, such as zinc tin aluminum oxide. The top dielectric layer may also include aluminum. The concentration of aluminum may be between about 1 atomic % and 15 atomic % or between about 2 atomic % and 10 atomic %. An atomic ratio
(Continued)

of zinc to tin in the top dielectric layer may be between about 0.67 and about 1.5 or between about 0.9 and about 1.1.

4 Claims, 7 Drawing Sheets

Related U.S. Application Data

(60) Provisional application No. 61/778,758, filed on Mar. 13, 2013.

(51) Int. Cl.
    *C03C 23/00*     (2006.01)
    *C23C 14/08*     (2006.01)
    *C23C 14/14*     (2006.01)
    *C23C 14/22*     (2006.01)
    *E06B 9/24*     (2006.01)
    *G02B 5/26*     (2006.01)

(52) U.S. Cl.
CPC ...... *C03C 17/3639* (2013.01); *C03C 17/3644* (2013.01); *C03C 17/3681* (2013.01); *C03C 23/007* (2013.01); *C23C 14/083* (2013.01); *C23C 14/14* (2013.01); *C23C 14/22* (2013.01); *E06B 9/24* (2013.01); *G02B 5/26* (2013.01); *C03C 2218/154* (2013.01); *E06B 2009/2417* (2013.01); *E06B 2009/2464* (2013.01)

(58) Field of Classification Search
CPC .................. G02B 5/285; G02B 5/208; C03C 17/06–17/10; C03C 17/36–17/3618; C03C 17/3626; C03C 17/3639–17/366; C03C 17/3681; C03C 2217/43; C03C 2217/48; B32B 15/00; B32B 15/04; B32B 15/043; C23C 14/083; C23C 14/085; C23C 14/14; C23C 14/16; C23C 14/18; C23C 14/34; C23C 14/58; C23C 14/5806; B29D 11/00865; E06B 9/24; E06B 2009/2464; G02F 1/091; G02F 2001/094; Y10T 428/24975; Y10T 428/265
USPC ....... 359/350, 351, 359, 360, 580, 584, 585, 359/589, 599, 601, 614, 884
See application file for complete search history.

(56) References Cited

U.S. PATENT DOCUMENTS

| | | |
|---|---|---|
| 5,821,001 A | 10/1998 | Arbab et al. |
| 5,935,702 A | 8/1999 | Macquart et al. |
| 6,159,621 A | 12/2000 | Schicht |
| 6,432,545 B1 | 8/2002 | Schicht et al. |
| 6,541,133 B1 | 4/2003 | Schicht |
| 7,229,533 B2 | 6/2007 | Veerasamy |
| 7,951,473 B2 | 5/2011 | Maschwitz |
| 9,481,603 B2 | 11/2016 | Reymond et al. |
| 9,499,899 B2 | 11/2016 | Zhang et al. |

FOREIGN PATENT DOCUMENTS

| | | |
|---|---|---|
| EP | 2 332 891 | 6/2011 |
| WO | WO 2005/000578 | 1/2005 |

OTHER PUBLICATIONS

U.S. Appl. No. 61/778,758, filed Mar. 13, 2013; Zhang et al.
Hersh et al., "Using Amorphous Zinc-Tin Oxide alloys in the emitter structure of CIGS PV devices," IEEE, 2011, pp. 001673-001676.
Perkins et al., "Combinatorial studies of Zn—Al-0 and Zn—Sn—O transparent conducting oxide thin films," Elsevier, Thin Solid Films, 411, 2002, pp. 152-160.

| Coating (ZnSnOx & NiCr) | | | TO5A spec | B-60-05 AC | B-60-05 HT | B-60-06 AC | B-60-06 HT |
|---|---|---|---|---|---|---|---|
| Monolithic Optics (Ill 'C', 2 deg obs) | T | Y (%) | (86, 89) | 87.82 | 88.95 | 85.93 | 88.67 |
| | | a* | (-2.8, 0.2) | -1.09 | -0.86 | -1.43 | -0.93 |
| | | b* | (-0.2, 3.8) | 2.53 | 1.76 | 2.08 | 2.5 |
| | Rg | Y (%) | (6.2, 7.2) | 5.67 | 5.35 | 5.34 | 4.98 |
| | | a* | (-3.5, -0.5) | -0.9 | -0.61 | 0.52 | 1.31 |
| | | b* | (-9.7, -5.7) | -10.28 | -9.69 | -10.95 | -9.86 |
| | Rf | Y (%) | (4.5, 5.5) | 4.64 | 4.42 | 4.12 | 4.05 |
| | | a* | (-2.7, 0.3) | -0.7 | -0.96 | 1.57 | 1.42 |
| | | b* | (-10.3, -6.3) | -10.02 | -8.01 | -10.77 | -8.33 |
| | Avis (100 - TT - TRf) | | (6.5, 8.5) | 7.54 | 6.63 | 9.95 | 7.28 |
| IGU Optics (Ill 'C', 2 deg obs) | T | Y (%) | (77.8, 80.8) | 79.6 | 80.6 | 77.8 | 80.3 |
| | | a* | (-3.6, -0.6) | -1.77 | -1.55 | -2.07 | -1.6 |
| | | b* | (0, 4) | 2.44 | 1.72 | 2.01 | 2.43 |
| | Rg | Y (%) | (12, 14) | 12 | 11.8 | 11.4 | 11.4 |
| | | a* | (-3.6, -0.6) | -1.32 | -1.03 | -0.63 | 0.04 |
| | | b* | (-7, -3) | -5.78 | -5.54 | -6.42 | -5.15 |
| | Rf | Y (%) | (11.3, 13.3) | 12 | 11.8 | 11.5 | 11.5 |
| | | a* | (-2.6, 0.4) | -0.78 | -0.88 | 0.18 | 0.11 |
| | | b* | (-6.7, -2.7) | -5.1 | -4.02 | -5.26 | -4.05 |
| Rs (ohms/sq) | | | (5.5, 6.5) | N/A | 4.25 | 6.45 | 4.36 |
| Normal Emissivity (EN) | | | (6.0%, 8.0%) | 0.06 | 0.04 | 0.07 | 0.07 |
| Haze (%) | | | < 0.6 | 0.38 | 1.03 | 0.36 | 1.27 |
| HT - AC | Rf ΔE* | | < 3 | | 1.1 | | 1.7 |
| | Rg ΔE* | | < 3 | | 2.1 | | 2.5 |
| | T ΔE* | | < 3 | | 0.9 | | 1.3 |
| | T \|Δb*\| | | < 1 | | 0.8 | | 0.4 |
| | T ΔY% (HT > AC) | | (0, 3) | | 1.1 | | 2.7 |
| NFRC 2001 Thermal Performance 3mm/ 12mm Ar / 3mm | Tsol | | (54.9%, 58.9%) | 57.10% | 58.50% | 54.90% | 56.70% |
| | SHGC(3) | | (0.64, 0.68) | 0.66 | 0.669 | 0.651 | 0.655 |
| | SHGC(2) | | (0.59, 0.63) | 0.614 | 0.627 | 0.591 | 0.609 |
| | LSG(3) | | (1.19, 1.23) | 1.21 | 1.2 | 1.2 | 1.23 |
| | LSG(2) | | (1.27, 1.31) | 1.3 | 1.28 | 1.32 | 1.32 |
| Tape Test | | | pass | pass | pass | pass | pass |

*FIG. 7*

SYSTEMS, METHODS, AND APPARATUS FOR PRODUCTION COATINGS OF LOW-EMISSIVITY GLASS INCLUDING A TERNARY ALLOY

CROSS-REFERENCE TO RELATED APPLICATIONS

This application is a continuation of application Ser. No. 14/139,350, filed Dec. 23, 2013, which claims benefit of Provisional Application Ser. No. 61/778,758 filed Mar. 13, 2013, the entire disclosures of which are all hereby incorporated herein by reference in this application.

TECHNICAL FIELD

The present disclosure relates generally to films providing high transmittance and low emissivity, and more particularly to such films deposited on transparent substrates.

BACKGROUND

Sunlight control materials, such as treated glass sheets, are commonly used for building glass windows and vehicle windows. Such materials typically offer high visible transmission and low emissivity thereby allowing more sunlight to pass through the glass window while block infrared (IR) radiation to reduce undesirable interior heating. In low emissivity (low-E) materials, IR radiation is mostly reflected with minimum absorption and emission, thus reducing the heat transferring to and from the low emissivity surface. Low-E panels are often formed by depositing a reflective layer (e.g., silver) onto a substrate, such as glass. The overall quality of the reflective layer is important for achieving the desired performance. In order to provide adhesion, as well as protection, several other layers are typically formed both under and over the reflective layer. These layers typically include dielectric layers, such as silicon nitride, tin oxide, and zinc oxide, which provide protect the stack from both the substrate and the environment. The dielectric layer may also act as optical fillers and function as anti-reflective coating layers to improve the optical characteristics of the panel.

A typical approach to reduce emissivity involves increasing the thickness of the reflective layer (e.g., the silver layer). However, as the thickness of the reflective layer increases, the visible light transmission of this layer is also reduced. Furthermore, the high thickness slows manufacturing throughput and increases costs. It may be desirable to keep the reflective layer as thin as possible, while still providing emissivity suitable for low-e applications.

SUMMARY

Disclosed herein are systems, methods, and apparatus for forming low-emissivity (low-E) panels. In some embodiments, low emissivity panels may include a substrate and a reflective layer formed over the substrate. The low emissivity panels may also include a top dielectric layer formed over the reflective layer such that the reflective layer is formed between the top dielectric layer and the substrate. In some embodiments, the top dielectric layer may include a zinc tin aluminum oxide. In some embodiments, a concentration of aluminum in the top dielectric layer is between about 1 atomic % and 15 atomic %. A concentration of aluminum in the top dielectric layer may be between about 2 atomic % and 10 atomic %. An atomic ratio of zinc to tin in the top dielectric layer may be between about 0.67 and about 1.5. The top dielectric layer may have a band gap of between about 3 eV and 6 eV. In some embodiments, the top dielectric layer is substantially amorphous. An absorption coefficient of the top dielectric layer may be about 0 for a wavelength range of between about 400 nm and 2500 nm. A thickness of the top dielectric layer may be between about 10 nm and 50 nm.

In some embodiments, the low emissivity panels may also include a barrier layer formed between the top dielectric layer and the reflective layer. The barrier layer may include a partially oxidized alloy of at least nickel, titanium, and niobium. In some embodiments, a partially oxidized alloy may be a mixture of two or more oxides in which at least one of the oxides is a non-stoichiometric oxide. In some embodiments, all oxides that form the partially oxidized alloy are non-stoichiometric oxides. The low emissivity panels may further include a top diffusion layer formed over the top dielectric layer such that the top dielectric layer is formed between the top diffusion layer and the barrier layer. The top diffusion layer may include silicon nitride. The low emissivity panels may also include a bottom diffusion layer formed between the substrate and the reflective layer. The bottom dielectric layer may be formed between the bottom diffusion layer and the substrate. The low emissivity panels may also include a seed layer formed between the bottom dielectric layer and the reflective layer.

In some embodiments, methods of forming low emissivity panels are provided. The methods may include providing a partially fabricated panel. The partially fabricated panel may include a substrate, a reflective layer formed over the substrate, and a barrier layer formed over the reflective layer such that the reflective layer is formed between the substrate and the barrier layer. The methods may also include forming a top dielectric layer over the barrier layer. The barrier layer may include a partially oxidized alloy of three or more metals. The top dielectric layer may include a zinc tin aluminum oxide. Furthermore, the top dielectric layer may be formed using reactive sputtering in an oxygen containing environment.

The methods may further include heat treating the partially fabricated panel having the top dielectric layer. In some embodiments, a transmittance of the low emissivity panels to visible light changes by less than 3% in response to the application of the heat treatment. A concentration of aluminum in the top dielectric layer may be between about 1 atomic % and 15 atomic %. A concentration of aluminum in the top dielectric layer may be between about 2 atomic % and 10 atomic %. An atomic ratio of zinc to tin in the top dielectric layer may be between about 0.67 and about 1.5. The top dielectric layer may be substantially amorphous. In some embodiments, a thickness of the top dielectric layer may be between about 10 nm and 50 nm. The methods may further include forming a top diffusion layer over the top dielectric layer. The top diffusion layer may include titanium nitride.

In some embodiments, methods of forming a low emissivity panels are provided. The methods may include providing a substrate and forming a bottom diffusion layer over the substrate. The methods may further include forming a bottom dielectric layer over the bottom diffusion layer and forming a seed layer over the bottom dielectric layer. The methods may also include forming a reflective layer over the seed layer and forming a barrier layer over the reflective layer. The methods may further include forming a top dielectric layer over the barrier layer. The barrier layer may include a partially oxidized alloy of three or more metals.

The top dielectric layer may include a zinc tin aluminum oxide. The top dielectric layer may be formed using reactive sputtering in an oxygen containing environment.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIG. 7 is an example of a score card identifying one or more optical properties of a dielectric layer, implemented in accordance with some embodiments.

DETAILED DESCRIPTION OF EXAMPLE EMBODIMENTS

Figure 1:
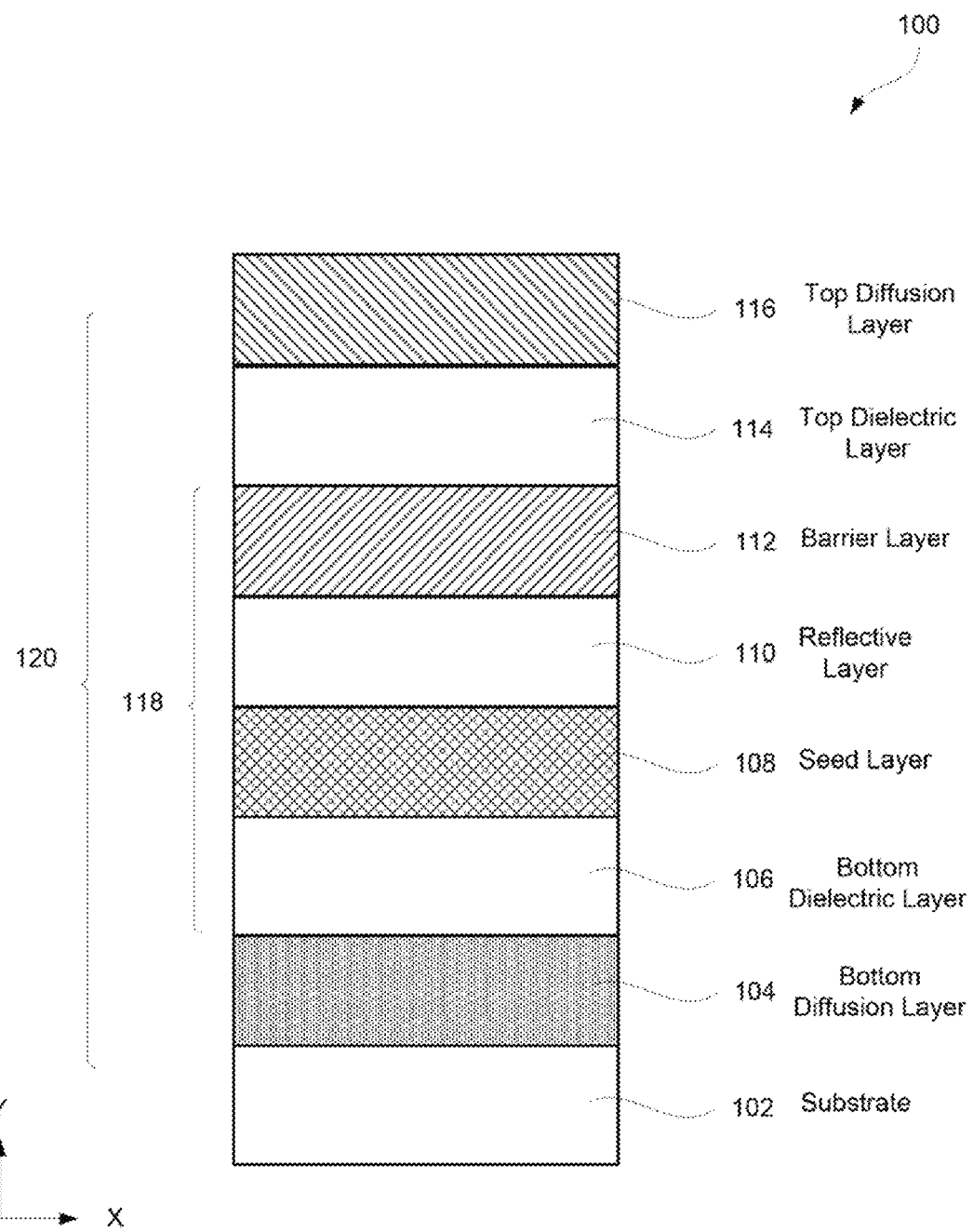
FIG. 1 is a schematic illustration of an article including a substrate and a stack of layers including one reflective layer formed over the substrate, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

Conventional low emissivity (low-E) coatings may include a stack of one or more layers which may be used as as-coated products, or tempered products. In tempered products, glass included in the low-E panel, which may be coated, may be heated up to about 650 degrees Celsius for up to 8 minutes. Upon tempering of the glass/stack, a color change may occur, thus making the as-coated product and heat treated (tempered) product different in appearance. Thus, conventional dielectric layers used in low-E panels may be susceptible to undesirable results which occur after a heat treatment, such as crystallization, decreased absorption of light in the blue wavelengths, and color change in the low-E glass.

Provided are low emissivity panels having top dielectric layers formed from zinc tin aluminum oxides. Also provided are methods of fabricating such panels. Unlike conventional low emissivity panels fabricated with tin oxide or binary metal oxides, the panels disclosed herein that include ternary metal oxides exhibit less color shift when subjected to heat treatment. Furthermore, transmission and reflectance characteristics of the panels disclosed herein are more stable than that of the conventional panels. Experimental results have shown that the transmission increases by less than 1% when the panels disclosed herein are subjected to heat treatment. Moreover, adding aluminum to zinc and tin increases the band gap of the resulting layer. In some embodiments, the concentration of aluminum in the top dielectric layer is between about 1 atomic % and 15 atomic % or, more specifically, between about 2 atomic % and 10 atomic %. An atomic ratio of zinc to tin in the top dielectric layer may be between about 0.67 and about 1.5 or, more specifically, between about 0.9 and about 1.1, such as about 1.

Examples of Low-Emissivity Coatings

A brief description of low-E coatings is provided for context and better understanding of various features associated with barrier layers and silver reflective layers. One having ordinary skills in the art would understand that these barrier and silver reflective layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a black body). The emissivity of a polished silver surface is 0.02. Reflectivity is inversely related to emissivity. When values of reflectivity and emissivity are added together, their total is equal 1.

FIG. 1 is a schematic illustration of an article 100 including a substrate 102 and a stack 120 of layers 104-116, in accordance with some embodiments. Specifically, stack 120 includes one reflective layer 110 formed over substrate 102 and protected by a barrier layer 112. Other layers in stack 120 may include bottom diffusion layer 104, top diffusion layer 116, bottom dielectric layer 106, top dielectric layer 114, and seed layer 108. Each one of these components will now be described in more details. One having ordinary skills in the art would understand that the stack may include fewer layers or more layers as, for example, described below with reference to FIGS. 2 and 3.

Substrate 102 can be made of any suitable material. Substrate 102 may be opaque, translucent, or transparent to the visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing the visible light through the substrate and diffusing this energy within the substrate, such that an object positioned on one side of the substrate is not visible on the other side of the substrate. The term "opaque" is defined as a visible light transmittance of 0%. Some examples of suitable materials for substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof. Substrate 102 may be also made from one or more metals, such as galvanized steel, stainless steel, and aluminum. Other examples of substrate materials include ceramics, glass, and various mixtures or combinations of any of the above.

Bottom diffusion layer 104 and top diffusion layer 116 may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_XN_Y$, where the X-to-Y ratio is between about 0.8 and 1.0. The refraction index of one or both diffusion layers 104 and 116 may be between about 2.0 and 2.5 or, more specifically, between about 2.15 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to substrate 102. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and substrate 102, the adhesion within this three-layer stack remains strong as evidenced by improved durability, especially after heat treatment.

Typically, each reflective layer provided in a stack is surrounded by two dielectric layers, e.g., bottom dielectric layer 106 and top dielectric layer 114 as shown in FIG. 1. Dielectric layers 106 and 114 are used to control reflection characteristics of reflective layer 110 as well as overall transparency and color of stack 120 and, in some embodiments, of article 100. Dielectric layers 106 and 114 may be made from the same or different materials and may have the same or different thickness.

In some embodiments, a dielectric layer may be made of a dielectric material that includes aluminum and zinc. For example, a dielectric layer, such as dielectric layer 106 and/or dielectric layer 114, may be made of zinc tin aluminum oxide. Unlike conventional low emissivity panels fabricated with tin oxide or a binary metal oxide, some embodiments disclosed herein utilize ternary metal oxides that exhibit less change in color when subjected to heat treatment. Furthermore, transmission and reflectance characteristics of the panels that include a ternary metal oxide, such as zinc tin aluminum oxide, are more stable than those of conventional panels, as is discussed in greater detail below with reference to FIG. 5, FIG. 6, and FIG. 7. Accordingly, a single stack configuration may be used for low emissivity panels that undergo multiple production processes because a single material included in the dielectric layers of the low emissivity panel may be used for as coated panels, but may also undergo heat treatment without undesirable effects, such as a change in color or transmissivity.

According to some embodiments, a dielectric layer may include aluminum in a concentration that is between about 1 atomic % and 15 atomic %. More specifically, the concentration of aluminum may be between about 2 atomic % and 10 atomic %. Moreover, as stated above, the ternary oxide included in the dielectric layer may also include zinc. An atomic ratio of zinc to tin in the top dielectric layer may be between about 0.67 and about 1.5. More specifically, the ratio of zinc to tin may be between about 0.9 and about 1.1, such as about 1. In some embodiments, a dielectric layer, such as dielectric layer 106 and/or dielectric layer 114, may also include Li, Be, Na, Mg, K, Ca, or Cd, which may be added to enhance one or more performance characteristics of article 100.

In some embodiments, adding aluminum to zinc and tin increases the band gap of the resulting layer. Thus, a dielectric layer, such as dielectric layer 106 and/or dielectric layer 114, that includes zinc tin aluminum oxide may have a band gap of at least 3 eV. In some embodiments, the dielectric layer may have a band gap of between about 3 eV and 6 eV.

The materials of dielectric layers 106 and 114 may be in amorphous phases, crystalline phases, or a combination of two or more phases. In some embodiments, a dielectric layer may be, at least in part, amorphous. Moreover, a dielectric layer that includes zinc tin aluminum oxide, as disclosed herein, may remain substantially amorphous even after a heat treatment has been applied to article 100. For purposes of this document, a material may be a substantially amorphous material if the crystalline phase composes less than 5% of the material by volume. Accordingly, dielectric layer 106 and dielectric layer 114 may each be substantially amorphous.

In some embodiments, dielectric layer 106 and dielectric layer 114 may have a thickness determined based on one or more desired optical and/or performance characteristics of article 100. For example, a dielectric layer made of zinc tin aluminum oxide may have a thickness that is thin enough to maintain a high transmissivity. In some embodiments, a dielectric layer may have a thickness of between about 10 nm and 50 nm.

In some embodiments, one or both dielectric layers 106 and 114 may include dopants, such as Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

In some embodiments, stack 120 includes seed layer 108. Seed layer 108 may be formed from $ZnO$, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. The material of seed layer 108 may be in a crystalline phase (e.g. greater than 30% crystalline as determined by X-ray diffraction). Seed layer 108 may function as a nucleation template for overlying layers, e.g., reflective layer 110. In some embodiments, the thickness of seed layer 108 is between about 30 Angstroms and 200 Angstroms, such as about 100 Angstroms.

Stack 120 includes reflective layer 110, which is formed from silver. The thickness of this layer may be between about 50 Angstroms and 200 Angstroms or, more specifically, between about 100 Angstroms and 150 Angstroms.

As noted above, stack 120 also includes barrier layer 112 to protect reflective layer 110 from oxidation and other damage. In some embodiments, barrier layer 112 may be formed from a partially oxidized alloy of at least nickel, titanium, and niobium. Barrier layer 112 may be formed from a quaternary alloy that includes nickel, chromium, titanium, and aluminum. The concentration of each metal in this alloy is selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering targets containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combination of two or more materials in the same target. The two targets may be exposed to different power levels. In the above example, the first target may be exposed to half as much power as the second target to achieve the desired composition. The barrier can be deposited substantially free of oxygen (e.g., predominantly as a metal) in the inert environment (e.g., argon environment). Alternatively, some oxidant (e.g., 15% by volume of $O_2$ in Ar) may be used to oxide the four metals. The concentration of oxygen in the resulting barrier layer may be between about 0% and 5% by weight.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

As stated above, barrier layer 112 may include a material that is an alloy of several metals. For example, barrier layer 112 may be a layer of a material, such as NiTiNb which may be configured to have a thickness between about 1.5 nm and 5 nm. In one example, barrier layer 112 has a thickness of 2.4 nm. Barrier layer 112 may be formed using a deposition technique, such as sputtering. During the forming process, a small amount of oxygen may be mixed with Argon to create a layer of NiTiNb oxide having an oxygen content between 10% to 30% by atomic weight. In some embodiments, barrier layer 112 may have a thickness of between about 1 Angstrom and 100 Angstroms or, more specifically, between about 5 Angstroms and 30 Angstroms, and even between about 10 Angstroms and 20 Angstroms.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scavenging layer.

Top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and give a smoother surface. Bottom diffusion layer 104 (e.g., formed from silicon nitride) can be silicon-rich to make film denser for better diffusion effect.

The overall stack 120 may have a sheet resistance of between about 6 Ohm/square to 8 Ohm/square when a silver reflective layer has a thickness between 80 Angstroms and 90 Angstroms. The sheet resistance of stack 120 may be between about 2 Ohm/square to 4 Ohm/square for a thickness of a silver reflective layer between 100 Angstroms and 140 Angstroms.

In some embodiments, a stack may include multiple reflective layers in order to achieve a specific performance. For example, the stack may include two, three, or more reflective layers. The multiple reflective layers may have the same or different composition and/or thicknesses. Each new reflective layer may have a corresponding dielectric layer (e.g., at least one layer formed in between two reflective layers), a seed layer, and a barrier layer. FIG. 1 illustrates a portion 118 of stack 120 that may be repeated. Stack portion includes dielectric layer 106 (or dielectric layer 114), seed layer 108, reflective layer 110, and barrier layer 112. In some embodiments, portion 118 may not include seed layer 108.

Figure 2:
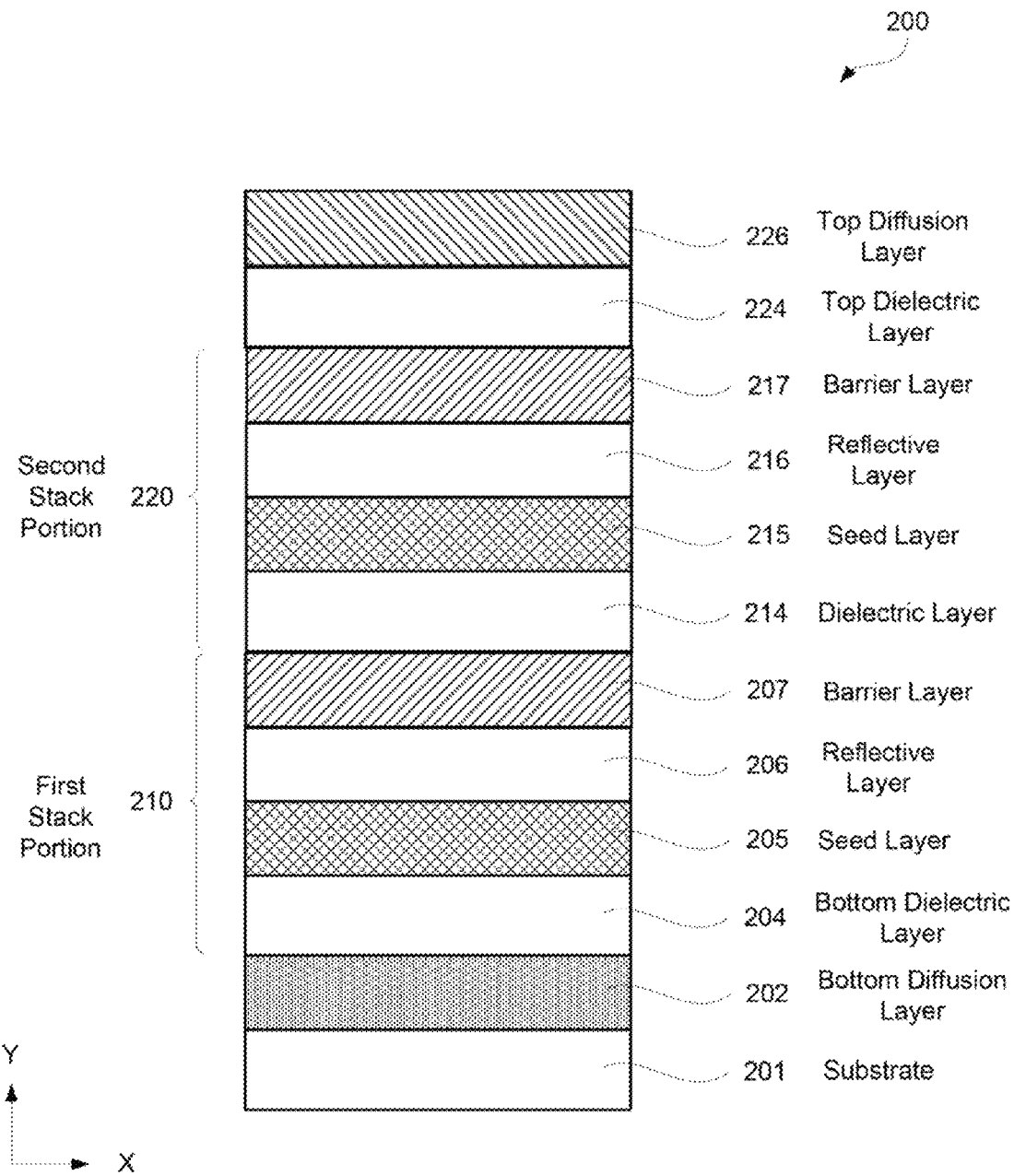
FIG. 2 is a schematic illustration of another article including a substrate and a stack of layers including two reflective layers formed over the substrate, in accordance with some embodiments.

FIG. 2 is a schematic illustration of another article 200 including a substrate 201 and a stack including two reflective layers 206 and 216, in accordance with some embodiments. Each one of reflective layers 206 and 216 is a part of a separate stack portion that includes other layers, i.e., reflective layer 206 is a part of first stack portion 210, while reflective layer 216 is a part of second stack portion 220. Other layers in first stack portion 210 include dielectric layer 204, seed layer 205, and barrier layer 207. Likewise, in addition to reflective layer 216, second stack portion 220 includes dielectric layer 214, seed layer 215, and barrier layer 217. It should be noted that reflective layers 206 and 216 are separated by only one dielectric layer 214. The overall article 200 also includes bottom diffusion layer 202, top dielectric layer 224, and top diffusion layer 226. As similarly discussed above with reference to FIG. 1, a reflective layer, such as reflective layer 206, may include silver. Moreover, a seed layer may include a metal oxide, as previously discussed with reference to seed layer 108 of FIG. 1, such as zinc oxide, titanium oxide, or tin oxide. A barrier layer may include a partially oxidized alloy of at least nickel, titanium, and niobium. Furthermore a dielectric layer may include zinc tin aluminum oxide.

Figure 3:
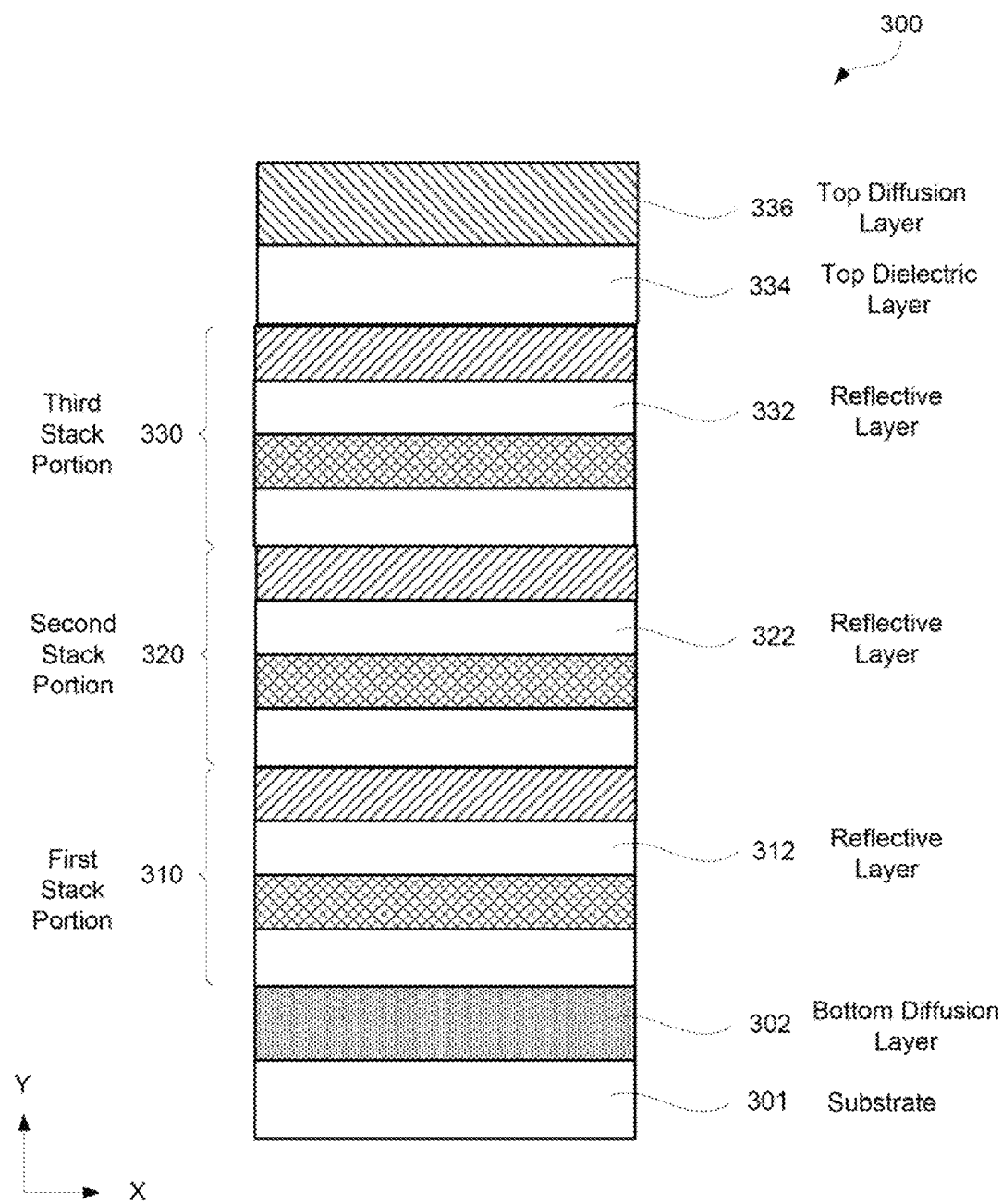
FIG. 3 is a schematic illustration of yet another article including a substrate and a stack of layers including three reflective layers formed over the substrate, in accordance with some embodiments.

FIG. 3 is a schematic illustration of yet another article 300 including a substrate 301 and three reflective layers, each being a part of as separate stack portion. Specifically, article 300 includes first stack portion 310 having reflective layer 312, second stack portion 320 having reflective layer 322, and third stack portion 330 having reflective layer 332. Other layers of article 300 also bottom diffusion layer 302, top dielectric layer 334, and top diffusion layer 336. As similarly discussed above with reference to FIG. 1 and FIG. 2, a reflective layer, such as reflective layer 312, may include silver. Moreover, a seed layer may include a metal oxide, as previously discussed with reference to seed layer 108 of FIG. 1, such as zinc oxide, titanium oxide, or tin oxide. A barrier layer may include a partially oxidized alloy of at least nickel, titanium, and niobium. Furthermore a dielectric layer may include zinc tin aluminum oxide.

Processing Examples

Figure 4:
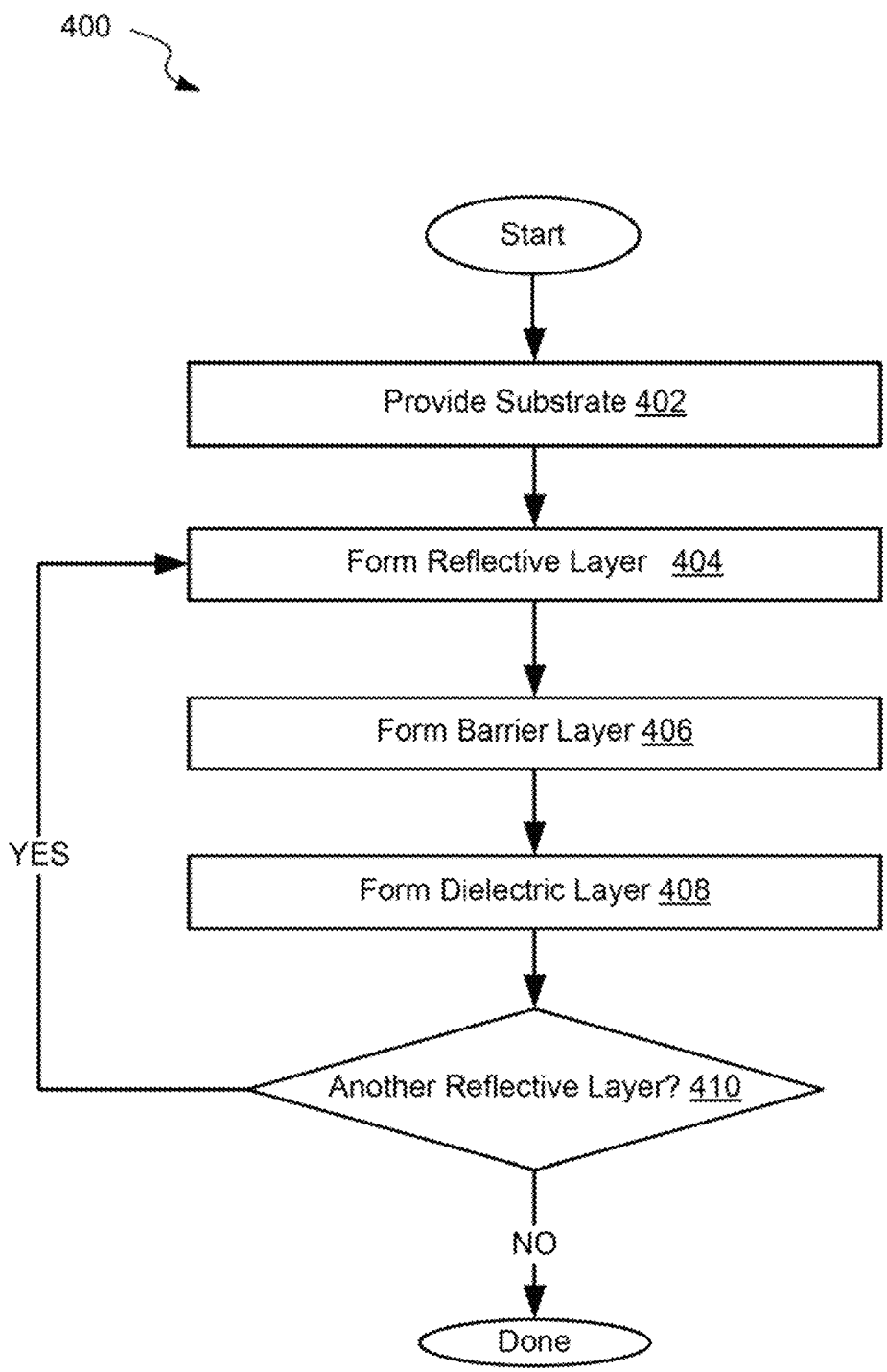
FIG. 4 is a process flowchart corresponding to a method for forming an article including a reflective layer and a barrier layer for protecting materials in this reflective layer from oxidation, in accordance with some embodiments.

FIG. 4 is a process flowchart corresponding to a method 400 of forming an article including a silver reflective layer and a barrier layer for protecting this reflective layer from oxidation, in accordance with some embodiments. Method 400 may commence with providing a substrate during operation 402. In some embodiments, the provided substrate is a glass substrate. The substrate may include one or more previous deposited layers. For example, the substrate may include a bottom diffusion layer, a bottom dielectric layer, and a seed layer. In some embodiments, one of more of these layers may not be present on the substrate. Various examples of these layers and substrates are described above with reference to FIG. 1.

Method 400 may proceed with forming a reflective layer over the substrate during operation 404 or, more specifically, over one or more layers previously formed on the provided substrate. This operation may involve sputtering silver in a non-reactive environment. The silver layer may be deposited in an argon environment at a pressure of 2 millitorr using 90 W power applied over a sputter area of about 45 cm$^2$ resulting in a power density of about 2000 W/m$^2$. The target to substrate spacing may be about 240 millimeters. The thickness of the reflective layer may be between about 50 Angstroms and 200 Angstroms.

Method 400 may proceed with forming a barrier layer over the reflective layer during operation 406. As noted above, the reflective layer may be formed from an alloy including one or more of nickel, chromium, titanium, niobium, and aluminum that is formed by co-sputtering of these metals in a non-reactive environment. In some embodiments, the barrier layer is deposited in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

Method 400 may then proceed with forming a dielectric layer over the barrier layer during operation 408. This operation may involve sputtering of zinc, tin, and aluminum using a physical vapor deposition (PVD) tool. Different power and/or distance combination and ratios may be used to vary the concentration and composition of the dielectric layer. As similarly discussed above with reference to FIG. 1, the concentration of aluminum in the top dielectric layer may be between about 1 atomic % and 15 atomic % or, more specifically, between about 2 atomic % and 10 atomic %. An atomic ratio of zinc to tin in the top dielectric layer may be between about 0.67 and about 1.5 or, more specifically, between about 0.9 and about 1.1, such as about 1. Zinc, tin, and aluminum may form a stoichiometric oxide in which zinc, tin, and aluminum have their highest oxidation states.

As similarly discussed above, according to some embodiments, the same type of interface layer, and the same process for forming the interface layer may be used regardless of which type of fabrication process is used to form the article which may be a portion or part of a low-E panel. For example, the same deposition technique and the same interface layer may be used regardless of whether the low-E panel is fabricated in accordance with an as-coated process, or whether the low-E panel is fabricated in accordance with a heat treatment process.

If another reflective layer needs to be deposited on the substrate, operations 404-408 may be repeated as indicated by decision block 410.

EXPERIMENTAL RESULTS

Figure 5:
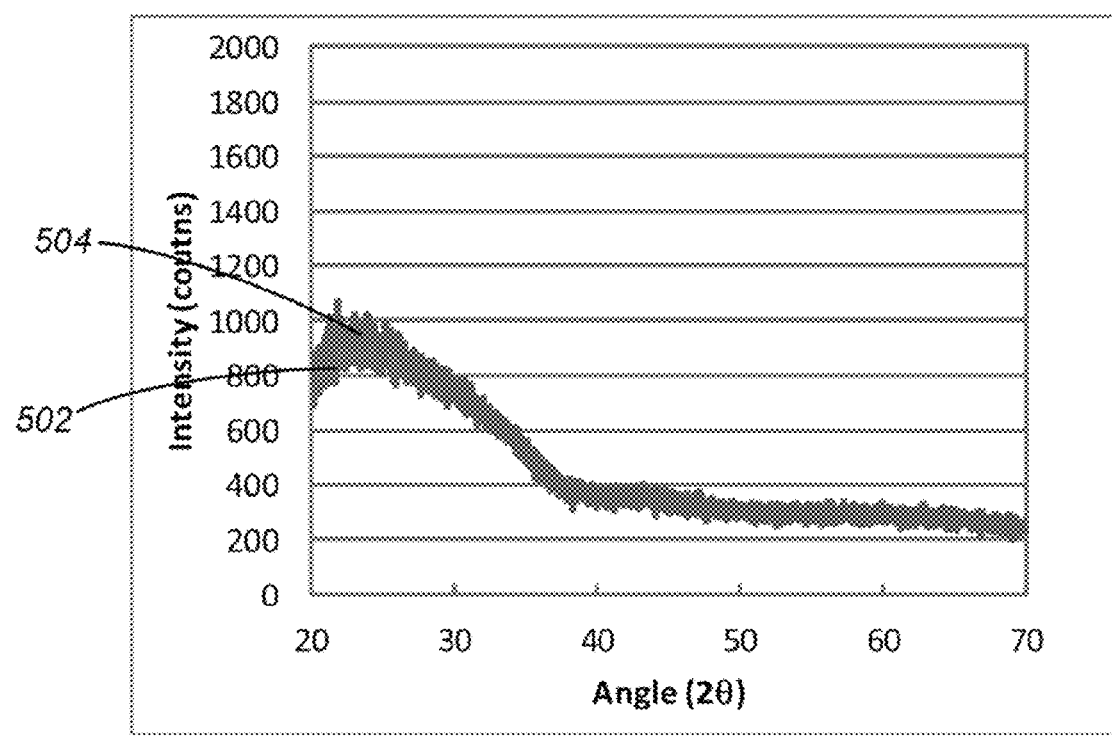
FIG. 5 is a graph illustrating the results of a structural analysis of one or more dielectric layers, implemented in accordance with some embodiments.

FIG. 5 is a graph illustrating the results of a structural analysis of one or more dielectric layers, implemented in accordance with some embodiments. As shown in FIG. 5, X-ray diffraction (XRD) spectroscopy was used to analyze structural properties of dielectric layers including materials as disclosed herein, such as zinc tin aluminum oxide. The XRD spectroscopic analysis was performed before and after the application of a heat treatment to stacks including at least one zinc tin aluminum oxide dielectric layer. For example, plot 502 illustrates data for a low emissivity window that has not received a heat treatment and is as-coated (AC). Moreover, plot 504 illustrates data for a low emissivity panel that has undergone a heat treatment (HT). As shown in FIG. 5, there are no peaks from 20-70 degrees in plot 502 and plot 504, thus indicating that the material included in the dielectric layer is amorphous before and after the application of the heat treatment.

Figure 6:
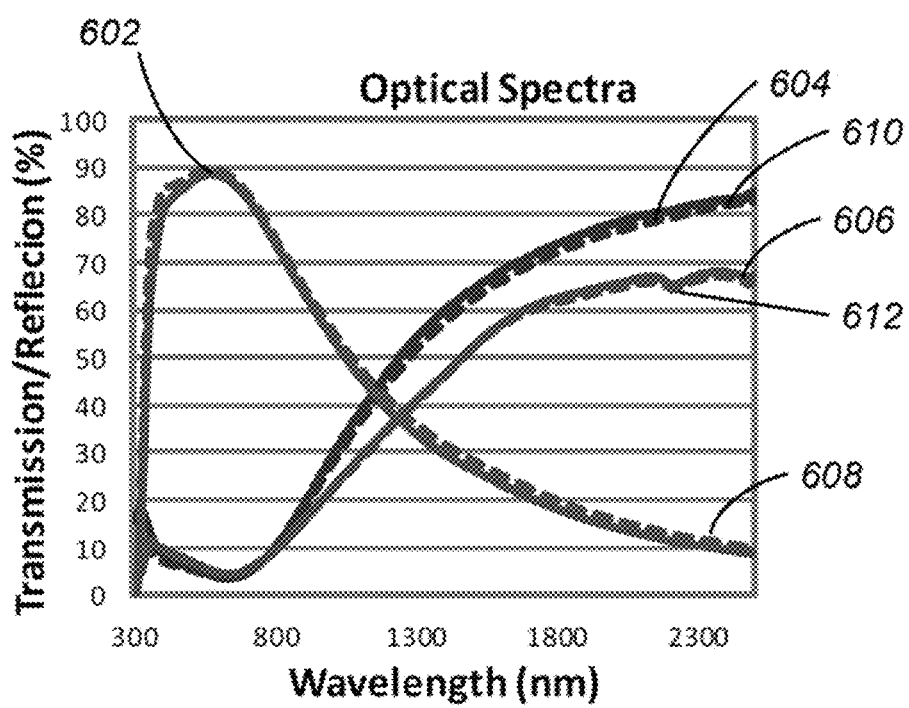
FIG. 6 is a graph illustrating transmission properties of one or more dielectric layers including zinc tin aluminum oxide prior to and after the application of a heat treatment, implemented in accordance with some embodiments.

FIG. 6 is a graph illustrating transmission properties of one or more dielectric layers including zinc tin aluminum oxide prior to and after the application of a heat treatment, implemented in accordance with some embodiments. As shown in FIG. 6, solid lines represent properties of low emissivity panels including one or more dielectric layers of zinc tin aluminum oxide as-coated (AC) and without the application of a heat treatment. For example, line 602 represents a transmissivity of the low emissivity panels, line 604 represents a film-side reflection of the low emissivity panels, and line 606 represents a glass-side reflection of the low emissivity panels as-coated (and prior to a heat treatment). Dashed lines represent properties of low emissivity panels including one or more dielectric layers of zinc tin aluminum oxide that have received a heat treatment (HT). For example, line 608 represents a transmissivity of the low emissivity panels, line 610 represents a film-side reflection of the low emissivity panels, and line 612 represents a glass-side reflection of the low emissivity panels after a heat treatment. As shown in FIG. 6, there is little difference between the solid and dashed lines, thus indicating that the application of the heat treatment to the low emissivity panels has little to no substantial effect on one or more optical characteristics of the low emissivity panels, and that the transmittance or transmissivity of the low emissivity panels to visible light may change by less than 3%.

FIG. 7 is an example of a score card identifying one or more optical properties of a dielectric layer, implemented in accordance with some embodiments. Among other properties, FIG. 7 describes color characteristics of low emissivity windows including dielectric layer stacks as disclosed herein. The color characteristics were measured and reported using the CIE LAB a*, b* coordinates and scale. In the CIE LAB color system, the "L*" value indicates the lightness of the color, the "a*" value indicates the position between magenta and green (more negative values indicate stronger green and more positive values indicate stronger magenta), and the "b*" value indicates the position between yellow and blue (more negative values indicate stronger blue and more positive values indicate stronger yellow).

Data are shown in columns "B-60-05 AC" and "B-60-05 HT" for as-coated stacks and heat treated stacks including a dielectric layer made of zinc tin aluminum oxide, as disclosed herein. As can be seen from FIG. 7, the low emissivity stacks described herein exhibit a high visible transmittance (TY %) of about 85-90%. Moreover, FIG. 7 indicates that the a* and b* values for each of the as-coated windows and the heat treated windows are very similar and do not substantially change once a heat-treatment has been applied. Accordingly, there is very little difference between a color of the glass-side reflection and film-side reflection of the as-coated panels and the heat treated panels. FIG. 7 further illustrates how the low emissivity stacks described herein exhibit low $R_g\Delta E$ and $R_f\Delta E$ values, also referred to herein as Delta E values, which may be overall metrics of changes in glass side and film side color characteristics of the low emissivity windows which may be calculated based on changes in L*, a*, and b* values. The low $R_g\Delta E$ and $R_f\Delta E$ values calculated based on a comparison of as-coated and heat treated L*, a*, and b* values indicate that the low emissivity panels disclosed herein exhibit a low change in color of glass-side reflection and film-side reflection in response to the application of a heat treatment, thus making them suitable for either manufacturing process.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A coated article comprising:

a glass substrate;

an infrared (IR) reflective layer comprising silver over at least the substrate, wherein the IR reflective layer comprising silver is located on and directly contacting a layer comprising zinc oxide;

a contact layer located on and directly contacting the IR reflecting layer comprising silver;

a dielectric layer formed over the IR reflective layer comprising silver and over the contact layer, so that the IR reflective layer is formed between at least the dielectric layer and the glass substrate, the dielectric layer comprising a zinc tin aluminum oxide, wherein an atomic ratio of zinc to tin in the dielectric layer is between about 0.67 and about 1.5, and wherein the dielectric layer comprises between about 1 atomic % and 15 atomic % aluminum; and a layer comprising silicon nitride located over at least the dielectric layer comprising zinc tin aluminum oxide.

2. The coated article of claim 1, wherein the dielectric layer is substantially amorphous.

3. The coated article of claim 1, wherein an absorption coefficient of the dielectric layer is about 0 for a wavelength range of between about 400 nm and 2500 nm.

4. The coated article of claim 1, wherein the contact layer is oxided and comprises nickel.

* * * * *